United States Patent [19]

Swanson et al.

[11] Patent Number: 5,528,239

[45] Date of Patent: Jun. 18, 1996

[54] LOW NOISE TRANSMISSION OF OUTPUT DATA FROM A DELTA-SIGMA MODULATOR

[75] Inventors: Eric J. Swanson, Buda; Charles D. Thompson, Austin, both of Tex.

[73] Assignee: Crystal Semiconductor Corporation, Austin, Tex.

[21] Appl. No.: 870,599

[22] Filed: Apr. 17, 1992

[51] Int. Cl.$^6$ .................................................. H03M 3/02
[52] U.S. Cl. .................................. 341/143; 341/76
[58] Field of Search ....................... 341/76, 143

[56] References Cited

U.S. PATENT DOCUMENTS

| | | | |
|---|---|---|---|
| 4,227,185 | 10/1980 | Kronlage | 340/347 |
| 4,459,591 | 1/1985 | Loomis | 364/724 |
| 4,509,037 | 4/1985 | Harris | 340/347 |
| 4,746,899 | 5/1988 | Swanson et al. | 340/347 |
| 4,972,436 | 1/1990 | Halim et al. | 375/28 |
| 5,012,244 | 4/1991 | Welland et al. | 341/143 |
| 5,030,954 | 7/1991 | Ribner | 341/172 |
| 5,039,989 | 8/1991 | Welland et al. | 341/143 |
| 5,079,550 | 1/1992 | Sooch et al. | 341/143 |
| 5,084,702 | 1/1992 | Ribner | 341/143 |
| 5,150,220 | 9/1992 | Yunus | 341/143 |
| 5,196,853 | 3/1993 | Abbiate et al. | 341/143 |

OTHER PUBLICATIONS

Del Signore et al., "A Monolithic 20–b Delta–Sigma A/D Converter," IEEE J. Solid–State Circuits, SC–25, Dec. 1990.
Adams, "Design and Implementation of an Audio 19–Bit Analog–to–Digital Converter Using Oversampling Techniques," J. Audio Eng. Soc., 32, Mar. 1986.
AT&T Bell Laboratories, *Transmission Systems for Communications*, 5th edition, 1982, Chapter 29.
Cataltepe, "Digitally Corrected Multi–bit ΔΣ Data Converters," et al., IEEE Proc. ISCAS '89, May 1989.
Carley, "A Noise–Shaping Coder Topology for 15–Bit Converters," IEEE J. Solid–State Circuits, SC–24, Apr., 1989.
AT&T Bell Laboratories, *Transmission Systems for Communications*, 5th edition, 1982, Chapter 28.

*Primary Examiner*—Marc S. Hoff
*Attorney, Agent, or Firm*—Robert D. Lott

[57] ABSTRACT

The output gates of a delta-sigma modulator can generate i(t) transient signal in the power supply lines of a delta-sigma modulator. These i(t) spikes, which would otherwise produce non-linearities which can be coupled into the frequency band of interest of the modulator, are made to be linear by using return-to-zero data encoding and by providing multi-bit outputs to the delta-sigma modulator in which the output states all have equal numbers of logic ones at the output lines for each of the output states.

14 Claims, 5 Drawing Sheets

LOW NOISE TRANSMISSION OF OUTPUT DATA FROM A DELTA-SIGMA MODULATOR

TECHNICAL FIELD

The present invention pertains to delta-sigma modulators and, more particularly, to low noise transmission of output data from a delta-sigma modulator.

BACKGROUND OF THE INVENTION

Delta-sigma analog-to-digital converters provide a digital output with excellent signal to noise ratio characteristics. The typical delta-sigma analog-to-digital converter comprises a delta-sigma modulator which receives an analog input signal and produces an oversampled digital signal which is filtered by a digital filter. A loop filter inside the delta-sigma modulator shapes the quantization noise typically into a high pass characteristic; that is, the noise is very low at low frequencies and very high at high frequencies. The digital filter provides low pass filter characteristics to ideally eliminate most of the quantization noise in the high frequencies.

In practical delta-sigma modulators, any operations which result in coupling a non-linear function of the quantization noise into the analog input must be carefully avoided. Such non-linearities can degrade the noise performance at frequencies in the band of interest. For example, the quantization noise component at frequency $f_s/2-\Delta$ can be modeled as $$g(kT) = a \cos [2\pi(f_s/2-\Delta)kT] \quad (1)$$

A square law non-linearity produces:

$$\begin{aligned} g^2(kT) &= a^2\cos^2[2\pi(f_s/2 - \Delta)kT] & (2) \\ &= a^2\{\cos[2\pi(f_s - 2\Delta)kT] + 1\}/2 & (3) \end{aligned}$$

Since $f_s = 1/T$, $$\begin{aligned} g^2(kT) &= a^2\{\cos[2\pi f_s kT - 2\pi(2\Delta)kT] + 1\}/2 & (4) \\ &= a^2\{\cos[2\pi k - 2\pi(2\Delta)kT] + 1\}/2 & (5) \\ &= a^2\{1 - \cos[2\pi(2\Delta)kT]\}/2 & (6) \end{aligned}$$

This equation contains a component at frequency $2\Delta$. Thus, non-linearities in a delta-sigma modulator system have the risk of taking high amplitude noise near $f_s/2$ and translating it down into the band of interest where the digital filter provides no attenuation.

Therefore it can be appreciated that a method for transmission of output data from a delta-sigma modulator which avoids injecting noise into the frequency band of interest is highly desirable.

SUMMARY OF THE INVENTION

It is, therefore, an object of this invention to provide a method for transmission of output data from a delta-sigma modulator which does not introduce noise into the frequency band of interest of the modulator.

Shown in an illustrated embodiment of the invention is a delta-sigma modulator which receives an analog input signal and provides a digital output of serial data characterized in that the transient signals generated by digital output are independent of the previous digital outputs.

Additionally shown in an illustrated embodiment of the invention is a delta-sigma modulator which receives an analog input signal and provides a digital output of serial data characterized in that the digital output is in the form of a noise-invariant code.

In a further aspect of the invention, the digital output consists of K digital states presented at N digital output terminals, wherein the sum of the number of transitions of a first polarity at said N digital output terminals for each digital state is the same for each of said K digital states.

Also shown in an illustrated embodiment of the invention is a delta-sigma modulator system having a plurality of delta-sigma modulators wherein the digital outputs of each of the plurality of delta-sigma modulators are time multiplexed into at least one digital data line, and each of the delta-sigma modulators are characterized in that the digital output of each modulator is in the form of a noise-invariant code.

BRIEF DESCRIPTION OF THE DRAWINGS

The aforementioned and other features, characteristics, advantages, and the invention in general, will be better understood from the following, more detailed description taken in conjunction with the accompanying drawings in which.

Figure 1:
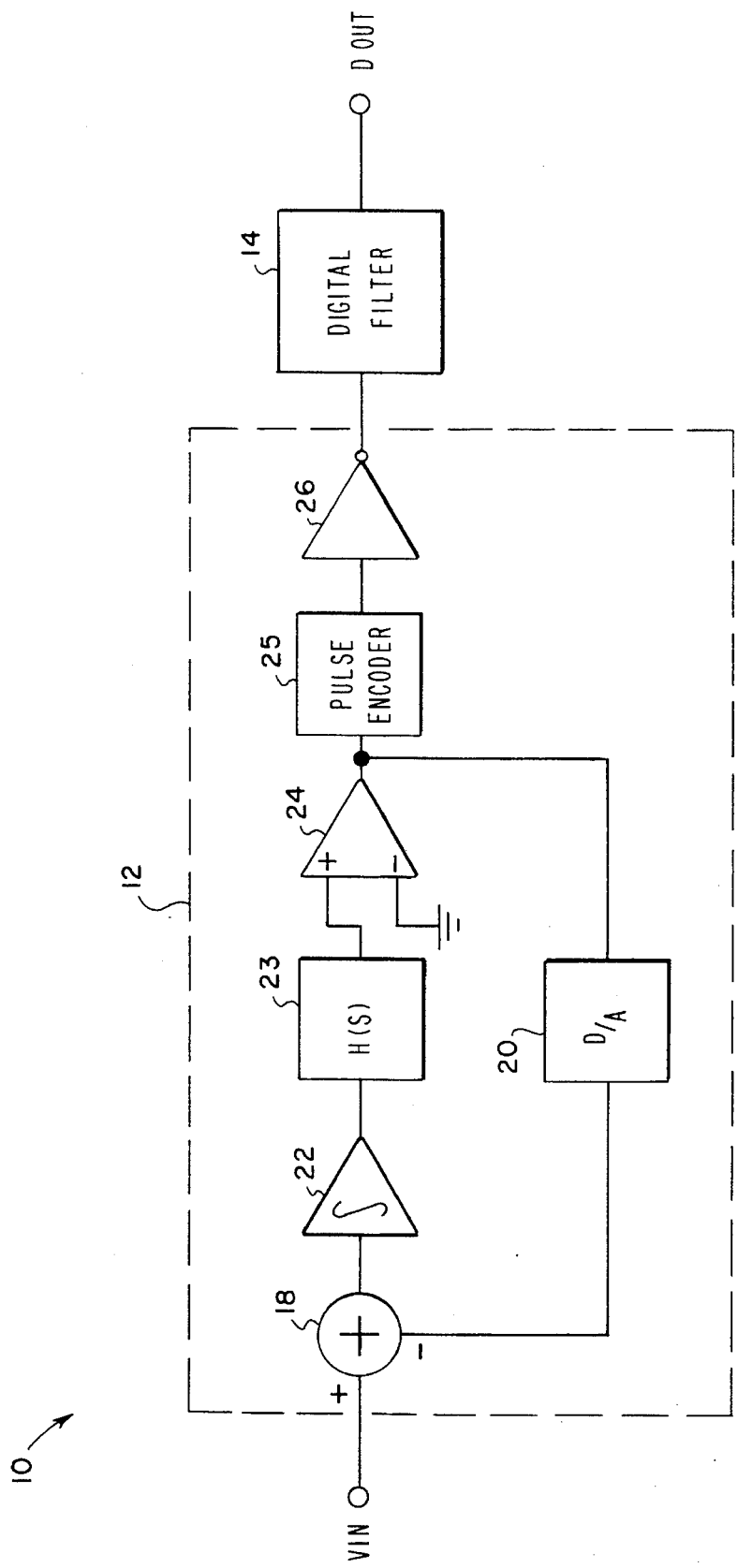
FIG. 1 is a block diagram of a one bit, two state delta-sigma converter.

It will be appreciated that for purposes of clarity, and where deemed appropriate, reference numerals have been repeated in the figures to indicate corresponding features.

DESCRIPTION OF THE PREFERRED EMBODIMENT

In a delta-sigma modulator, the pattern of transitions of the digital output can be a source of non-linear processing which can generate unwanted noise in the frequency band of interest in the modulator. Shown in FIG. 1 is a delta-sigma analog-to-digital converter 10 in which an analog input signal VIN is coupled into a delta-sigma modulator 12 to provide an oversampled serial data stream to a digital filter 14. The digital filter 14 low pass filters the digital data to provide a filtered serial output data DOUT. Inside the delta-sigma modulator 12 is a summing circuit 18 which sums the analog input voltage with the output from a digital-to-analog (D/A) converter 20. The output of the summing circuit 18 is coupled into an integrator 22, the output of which is coupled into a loop filter 23. The output of the loop filter 23 is coupled to the input of a comparator 24. The output of the comparator 24 is a digital signal which is coupled to the input of a pulse encoder 25 and to the input of the digital-to-analog converter 20. The output of the pulse encoder 26 is coupled to the input of a CMOS output buffer and inverter 26 (hereinafter referred to as inverter 26). The output of the inverter 26 forms the output of the delta-sigma modulator 12.

Figure 2:
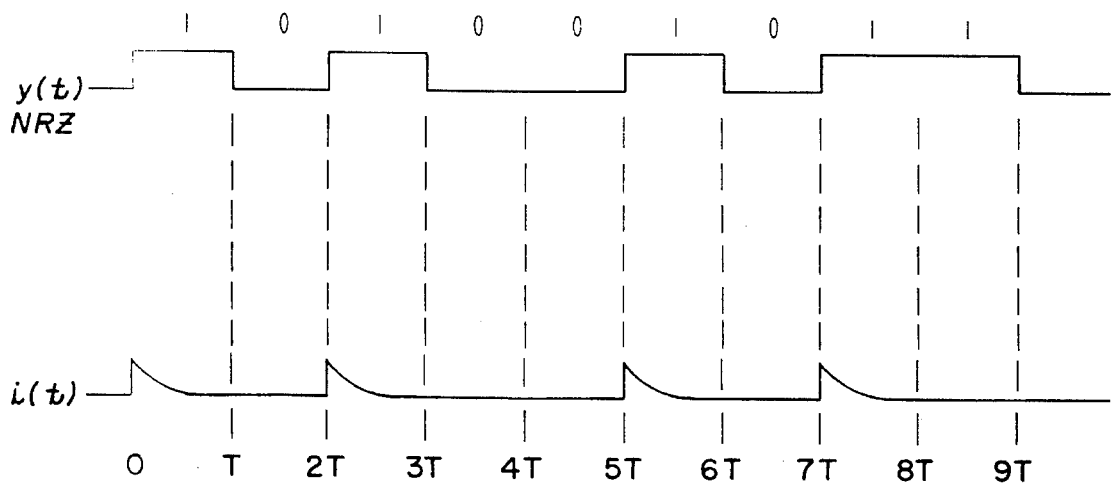
FIG. 2 shows plots of certain signals generated in a prior art version of the delta-sigma converter shown in FIG. 1.
Figure 3:
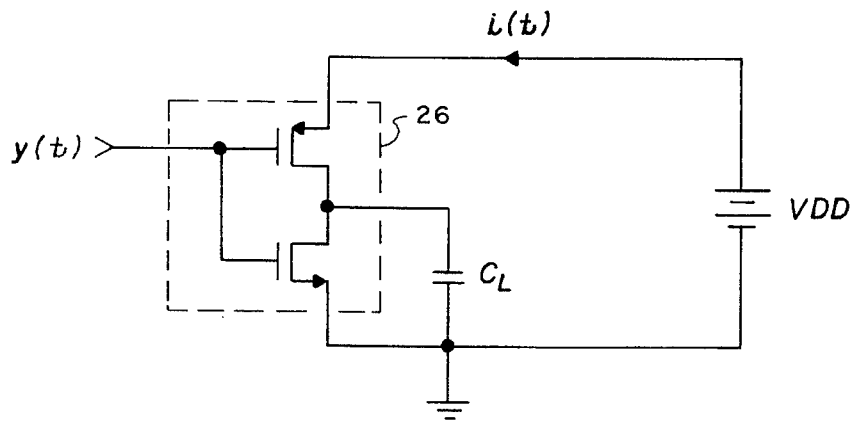
FIG. 3 is a schematic diagram of the inverter 26 shown in FIG. 1.

FIG. 2 shows a plot of y(t), the output of the comparator/pulse encoder 25 when the pulse encoder is generating non-return-to-zero (NRZ) data. The CMOS inverter 26 is shown schematically in FIG. 3. Each time the inverter 26 pulls up the load of the capacitor $C_L$ a current transient i(t) occurs on the power supply line. These current transients are also shown in FIG. 2. Upon examination of FIG. 2 it will be observed that the transients i(t) are data dependent except at a time when two consecutive logical ones appear such as at time 8T. Since no current spike occurs at time 8T a non-linear transient current is being injected onto the VDD line of the circuit.

Figure 4:
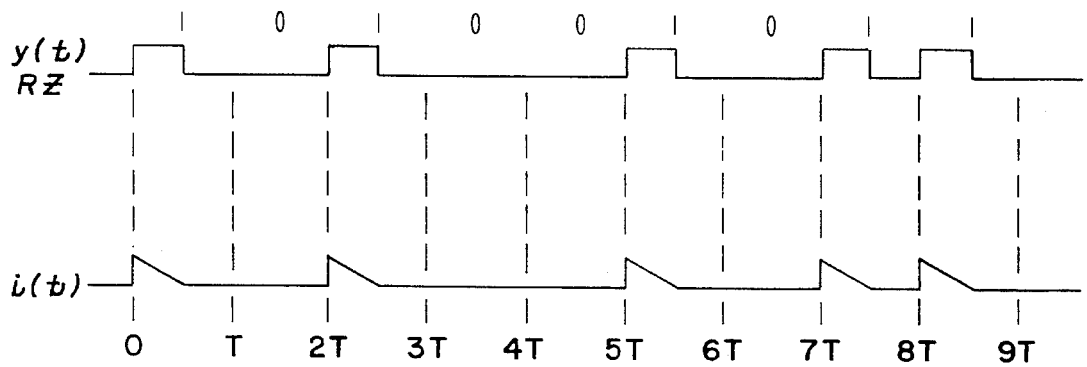
FIG. 4 shows plots of certain signals generated in the delta-sigma converter shown in FIG. 1 according to the present invention.

The pulse encoder 25 may be is configured to generate a pulse coding which, for each output state, is independent of the previous output states. Such previous state independent coding eliminates the non-linear current transients resulting from the condition of consecutive ones on the output data. One type of such prior state independent coding is return-to-zero (RZ) coding. FIG. 4 is a timing diagram of y(t) using RZ coding. FIG. 4 also shows the i(t) transient. As shown in FIG. 4, consecutive ones on the y(t) signal produce consecutive i(t) transients on the VDD line. Circuitry for encoding NRZ and RZ data is well known in the art and therefore not shown in the drawings.

Figure 5:
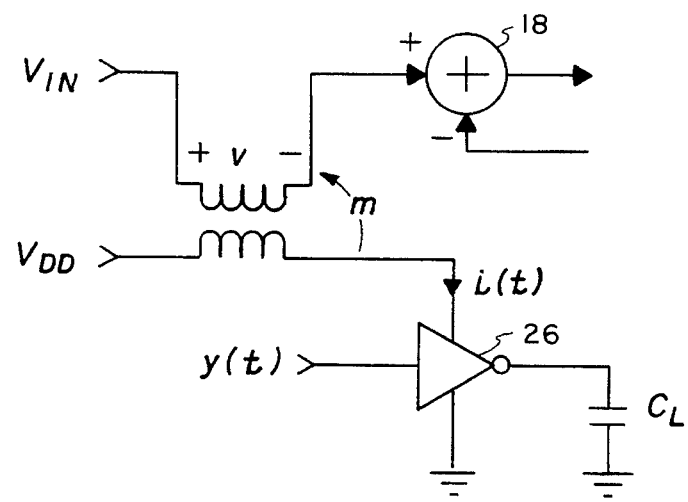
FIG. 5 is a partial block diagram of the delta-sigma converter shown in FIG. 1.

FIG. 5 is a partial block diagram of the delta-sigma modulator 12 showing the summing circuit 18 and the inverter 26. FIG. 5 illustrates how i(t) current spikes can couple into the analog input of the delta-sigma modulator 12. As i(t) changes, the magnetic field produced by i(t) changes, and a voltage is produced in series with the analog input of $$v = M \, di/dt \quad (7)$$

Although the i(t) signal is shown in FIG. 5 as being coupled into the analog input signal VIN, the i(t) signal can also be coupled by the same mechanism into the reference voltage signal used in the delta-sigma modulator. The value of M is influenced by such factors as proximity of the loop carrying i(t) to the input, the orientation of the loop with respect to the input, the size of the i(t) loop, use of ground planes, and other factors. Yet M cannot be reduced to zero, and significant coupling originates within the lead frame of the integrated circuit package, especially for high dynamic range delta-sigma analog-to-digital converters. Preserving the linearity of the i(t) paths is thus of considerable importance.

Figure 6:
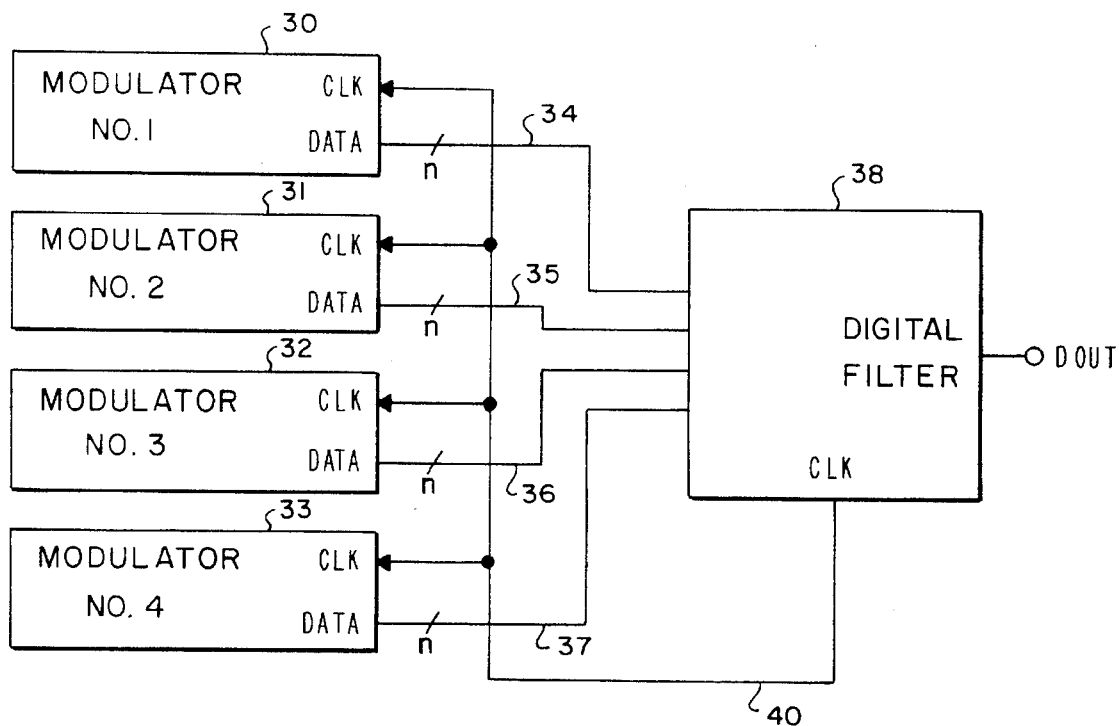
FIG. 6 is a block diagram of a multiplexed delta-sigma analog-to-digital system.

FIG. 6 is a block diagram of a multiplexed delta-sigma analog-to-digital converter. As shown in FIG. 6, four delta-sigma modulators 30, 31, 32, and 33 provide digital data on data buses 34, 35, 36, and 37, respectively, to a single digital filter 38. The delta-sigma modulators 30–33 are similar to the delta-sigma modulator 12 shown in FIG. 1. The digital filter 38 provides a clock signal on line 40 to the four modulators 30–33 to synchronize the four modulators 30–33. The data output buses of the modulators are time multiplexed in the digital filter 38; that is, the digital filter 38 samples each of data buses 34–37 individually between each sampling period. The multiplexed filter eliminates three digital filters from the system. The data buses 34–37 are shown as being of n lines or bits in width. The number of bits can be 1 or greater. The case in which n is greater than 1 is discussed below with in conjunction with FIGS. 8 and 9.

In one embodiment of such subsystems the modulators 30–33 are on a single chip in one integrated circuit package while the digital filter 38 is in a separate package. Since the $C_L$ loads shown in FIG. 3 include not only the interconnection on the chip but also the interconnection between two integrated circuit packages, these loads can be on the order of 30 pF rather than being of less than 1 pF for interconnections inside an integrated circuit chip. As a result the size of the transistors inside the inverter 26 must generally be increased which in turn produces much larger i(t) signals. Furthermore, the multiplexing scheme can result in one modulator interfering with the operation of another modulator.

Figure 7:
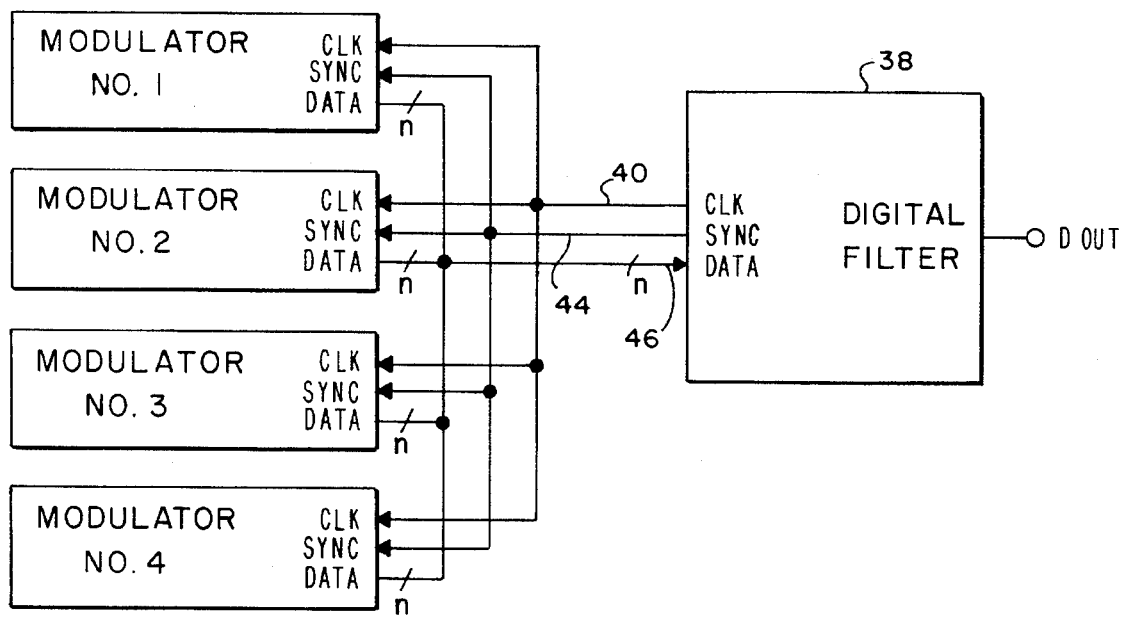
FIG. 7 is a block diagram of a multiplexed delta-sigma analog-to-digital system having a multiplexed data bus.

FIG. 7 is a modification of the multiplexed modulator shown in FIG. 6. In FIG. 7 the four separate data buses have been coupled to a multiplexed databus 46 and a sync signal 44 from the digital filter 38 is used to synchronize the four modulators. The multiplexed databus configuration shown in FIG. 7 is even more susceptible to digital-analog interference since signals generated by one modulator are coupled directly into the outputs of all the other modulators.

Figure 8:
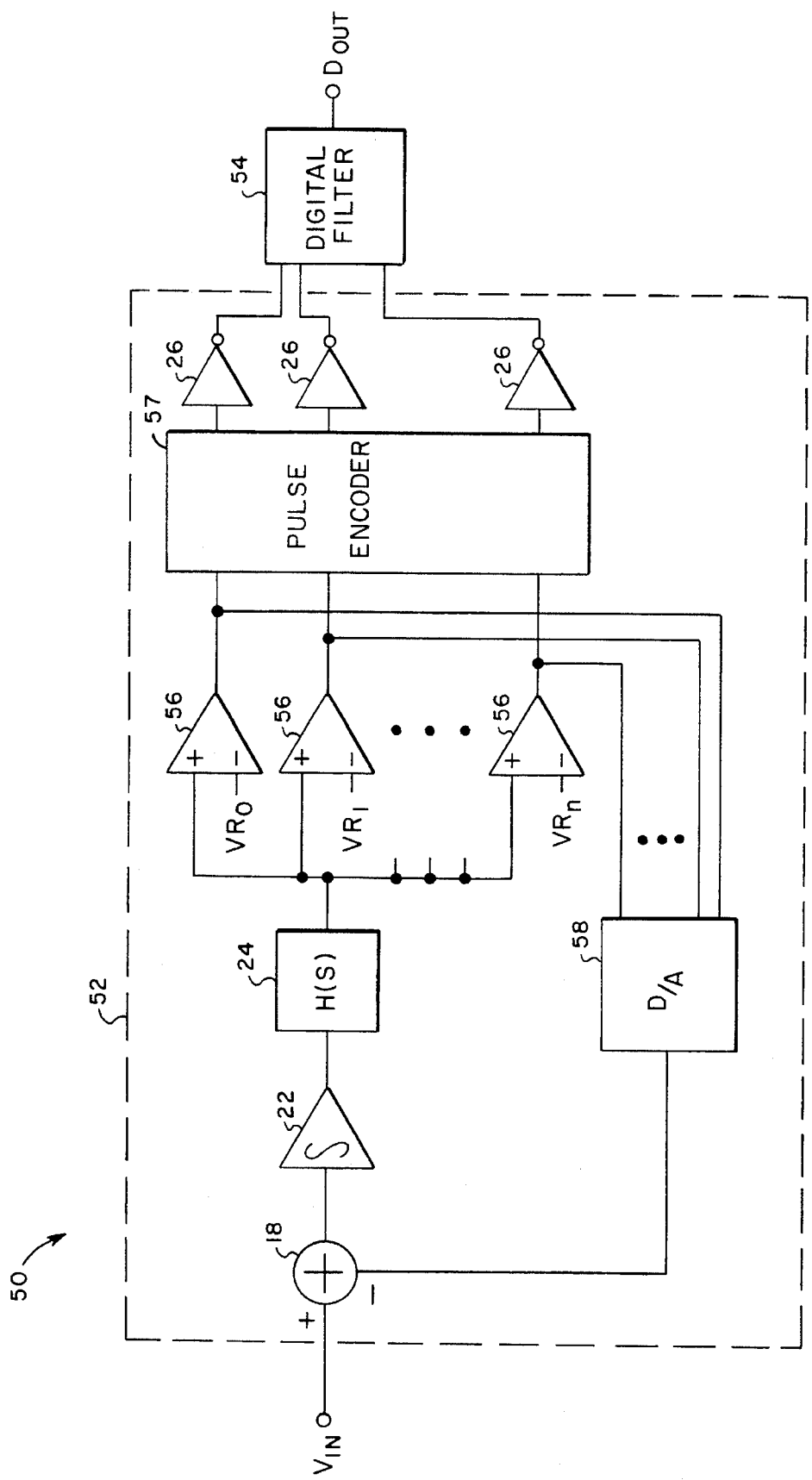
FIG. 8 is a block diagram of a multibit, multistate delta-sigma analog-to-digital converter.

FIG. 8 is a block diagram of a multibit, multistate delta-sigma analog-to-digital converter 50 which includes a multibit, multistate delta-sigma modulator 52 and a multibit digital filter 54. The delta-sigma modulator 52 is the same as the delta-sigma modulator 12 of FIG. 1 except that n comparators 56 are connected to the output of the loop filter 24. Each comparator 56 compares the output of the loop filter 24 to a different reference voltage $VR_0, VR_1, \ldots VR_n$ to provide n digital output signals. Connected to the outputs of each comparator 56 is an input to a multibit digital-to-analog converter 58, and an input to a multibit pulse encoder 57, the corresponding outputs of which are connected to inverters 26. The outputs of the inverters provide digital signals $b_0, b_1, \ldots b_n$, respectively. The digital signals $b_0$–$b_n$ are input to the digital filter 54.

Figure 9:
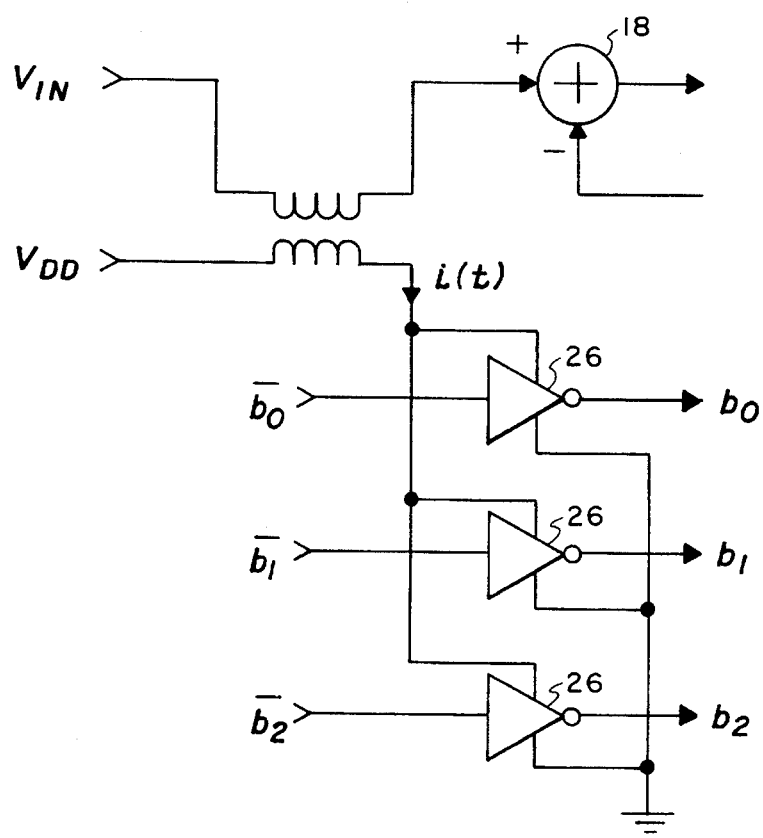
FIG. 9 is a partial block diagram of one version of the delta-sigma converter shown in FIG. 8.

FIG. 9 is a partial block diagram of a three bit form of the delta-sigma modulator shown in FIG. 8. Shown in FIG. 9 are the three inverters 26 which receive input signals $\bar{b}_0, \bar{b}_1,$ and $\bar{b}_2$ to provide output signals $b_0, b_1,$ and $b_2$ respectively. As shown in FIG. 8 the i(t) signal generated by these inverters is coupled into the input of the summing circuit 18.

The following is a discussion of output state encoding in which RZ pulse encoding is used in the system.

If the circuit of FIG. 8 is used to produce three output levels and three feedback levels, then prior art delta-sigma modulators would only use two outputs, $b_0$ and $b_1$, to produce the three levels shown in the table below:

| Feedback and Output Levels | Output Bits | |
|---|---|---|
| | $b_0$ | $b_1$ |
| −1 | 0 | 1 |
| 0 | 0 | 0 |
| 1 | 1 | 0 |

Examination of the above table will show that either one of the bits flip or none do. The resulting i(t) signals are therefore a non—linear function of the feedback signal—in this case a rectification.

If, however, for a three level delta-sigma modulator system three outputs lines $b_0, b_1,$ and $b_2$ are chosen according to the table below, then the i(t) signal becomes pattern independent:

| Feedback and | Output Bits | | |
|---|---|---|---|
| Output Levels | $b_0$ | $b_1$ | $b_2$ |
| −1 | 0 | 0 | 1 |
| 0 | 0 | 1 | 0 |
| 1 | 1 | 0 | 0 |

When the table above is used to generate the three logic states, then one and only one inverter pulses each sampling period providing a parasitic coupling of i(t) which is independent of the output of the modulator. This coding is therefore noise invariant. Any errors inductively coupled into the input or reference voltage occur repetitively at the sampling frequency and alias into the easy-to-calibrate-out digital offsets.

The following table demonstrates another selection of the three output states with this equal number of transitions property:

| Feedback and | Output Bits | | |
|---|---|---|---|
| Output Levels | $b_0$ | $b_1$ | $b_2$ |
| −1 | 0 | 1 | 1 |
| 0 | 1 | 0 | 1 |
| 1 | 1 | 1 | 0 |

In the table above two of three outputs transition each sampling period.

The noise-invariant encoding can also be applied to a two state delta-sigma modulator by providing two output states, $b_0$ and $b_1$ according to the table below.

| Feedback and | Output Bits | |
|---|---|---|
| Output Levels | $b_0$ | $b_1$ |
| 0 | 0 | 1 |
| 1 | 1 | 0 |

Using RZ encoding one driver output supports each sampling period and i(t) is independent of the output bits.

In general, if the sum of the number of logical ones for each output state of the output bit lines is equal to the sum of the number of ones for every other output state on the output lines, and if RZ encoding is used, the i(t) transients will be independent of the data.

The tables above can be generalized for an n-bit modulator output word. An n-bit modulator output word can represent $2^n$ output states. Of these states, the number of states with K active bits is given by $N_K$ where $$N_K = \frac{n!}{k!(n-k)!} \quad (8)$$

For example, in a system with four data lines, the number of output states which include two ones is given by $$N_2 = \frac{4!}{2!(4-2)!} = \frac{4 \cdot 3 \cdot 2}{4} = 6 \quad (9)$$

Therefore, four lines can encode up to six states using this noise-invariant coding. The following table shows these six patterns.

| Feedback and | Output Bits | | | |
|---|---|---|---|---|
| Output Levels | $b_0$ | $b_1$ | $b_2$ | $b_3$ |
| 0 | 0 | 0 | 1 | 1 |
| 1 | 0 | 1 | 0 | 1 |
| 2 | 0 | 1 | 1 | 0 |
| 3 | 1 | 0 | 0 | 1 |
| 4 | 1 | 0 | 1 | 0 |
| 5 | 1 | 1 | 0 | 0 |

Over range and instability information can also be assigned to output states. For example the table above could use the first four levels (0–3) as data states and use the last two levels (4 and 5) to encode overrange and instability information. Thus, even when one modulator's analog section is operating improperly, its digital output patterns need not interfere with other delta-sigma modulators sharing the same synchronously multiplexed databus.

Furthermore, the output of the digital filter can also be encoded with this noise-invariant coding.

By the use of this noise-invariant encoding, the i(t) transient signals which generally produce non-linear transients, which can be coupled into the frequency band of interest, have been virtually eliminated. By the use of this noise-invariant coding, a particular inefficient encoding scheme has been developed which is optimized for reducing interference between a delta-sigma modulator's digital outputs and its analog inputs.

Although the invention has been described in part by making detailed reference to a certain specific embodiment, such detail is intended to be, and will be understood to be, instructional rather than restrictive. It will be appreciated by those skilled in the art that many variations may be made in the structure and mode of operation without departing from the spirit and scope of the invention as disclosed in the teachings contained herein.

What is claimed is:

1. A delta-sigma modulator which receives an analog input signal and provides a digital output of serial data in an output stage of the delta-sigma modulator wherein said digital output is in the form of a code which, for each sampling period, is output transient noise-invariant as compared to any other sampling period, and wherein said output transient noise produced by each bit of a first logic state of said digital output is independent of any previous of said digital outputs and wherein said output transient signals produced by each bit of a second logic state of said digital output is independent of any previous of said digital outputs.

2. A delta-sigma modulator which receives an analog input signal and provides N digital output signals at N digital output terminals wherein said N digital output signals during each output bit period encodes into one of K digital logic states wherein K is the number of allowed permutations of said N output signals and is less than $2^N$ and wherein the sum of the number of said N digital output terminals which produce a transient signal of a first polarity is the same for each of said K digital logic states.

3. The delta-sigma modulator set forth in claim 2 wherein K is equal to 2 and N is equal to 2, and each of said digital states is encoded with one of said digital output terminals having said first logic state and the other of said digital output terminals having said second logic state.

4. The delta-sigma modulator set forth in claim 3 wherein K is equal to 3 and N is equal to 2, and wherein the sum of the number of said 3 digital output terminals having a first logic state is the same for each of said 3 digital states.

5. A delta-sigma modulator system having a plurality of delta-sigma modulators according to claim 2 wherein the digital outputs of each of said plurality of delta-sigma modulators are time multiplexed onto at least one digital data line.

6. The delta-sigma modulator set forth in claim 2 wherein said digital output consists of a single line of return-to-zero encoded data.

7. The delta-sigma modulator set forth in claim 2 wherein said output bit period is an integral multiple of a modulator sampling bit period.

8. A delta-sigma modulator which receives an analog input signal and provides a digital output of serial data in an output stage of the delta-sigma modulator characterized in that said digital output is in the form of return-to-zero encoded data and wherein said digital output consists of K digital states presented at N digital output terminals, wherein the sum of the number of said N digital output terminals having a first logic state is the same for each of said K digital states.

9. The delta-sigma modulator set forth in claim 8 wherein K is equal to 2 and N is equal to 2, and each of said digital states is encoded with one of said digital output terminals having a first logic state and the other of said digital output terminals having a second logic state.

10. The delta-sigma modulator set forth in claim 8 wherein K is equal to 3 and N is equal to 3, and the sum of the number of said 3 digital output terminals having a first logic state is the same for each of said 3 digital states.

11. A delta-sigma modulator system having a plurality of delta-sigma modulators according to claim 8 wherein the digital outputs of each of said plurality of delta-sigma modulators are time multiplexed onto at least one digital data line.

12. A delta-sigma analog-to-digital convertor having a delta-sigma modulator which receives an analog input signal and provides a digital output of modulated data to a digital filter which filters said digital output to provide N filtered digital output signals at N digital output terminals in an output stage of said digital filter wherein said N filtered digital output signals during each output bit period encodes into one of K digital logic states wherein K is the number of allowed permutations of said N output signals and is less than $2^N$ and, wherein the sum of the number of said N digital output terminals which produce a transient signal of a first polarity is the same for each of said K digital logic states.

13. The delta-sigma convertor set forth in claim 12 wherein said output bit period is an integral multiple of a modulator sampling bit period.

14. A delta-sigma analog-to-digital convertor having a delta-sigma modulator which receives an analog input signal and provides a digital output of serial data to a digital filter which filters said digital output to provide a filtered digital output in an output stage of said digital filter characterized in that said filtered digital output is in the form of return-to-zero encoded data.

* * * * *